United States Patent
Corbin et al.

(10) Patent No.: US 6,658,604 B1
(45) Date of Patent: Dec. 2, 2003

(54) METHOD FOR TESTING AND GUARANTEEING THAT SKEW BETWEEN TWO SIGNALS MEETS PREDETERMINED CRITERIA

(75) Inventors: William R. Corbin, Underhill, VT (US); David P. Monty, Essex Junction, VT (US); Erik A. Nelson, Waterbury, VT (US); Alan D. Norris, Hinesburg, VT (US); Steven W. Tomashot, Williston, VT (US); David E. Chapman, Shelburne, VT (US); Timothy E. Fiscus, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 554 days.

(21) Appl. No.: 09/685,939

(22) Filed: Oct. 10, 2000

(51) Int. Cl.[7] .......................... G11B 20/20; G06F 13/42; H04L 5/00
(52) U.S. Cl. ........................ 714/700; 713/400
(58) Field of Search ................. 714/700, 814, 714/815, 817, 811, 819; 713/400, 401, 503

(56) References Cited

U.S. PATENT DOCUMENTS

| | | | | |
|---|---|---|---|---|
| 5,621,739 A | * | 4/1997 | Sine et al. | 714/724 |
| 5,732,047 A | * | 3/1998 | Niijima | 368/10 |
| 6,003,118 A | | 12/1999 | Chen | 711/167 |
| 6,112,284 A | * | 8/2000 | Hayek et al. | 711/167 |
| 6,560,661 B2 | * | 5/2003 | Toda et al. | 710/61 |

FOREIGN PATENT DOCUMENTS

| | | |
|---|---|---|
| JP | 2271273 | 11/1990 |
| JP | 10078907 | 3/1998 |

* cited by examiner

*Primary Examiner*—Christine T. Tu
(74) *Attorney, Agent, or Firm*—Schmeiser, Olsen & Watts; Robert A. Walsh

(57) ABSTRACT

To overcome these problems, the present invention generates two window strobes and uses the two window strobes to determine if skew between two signals meets predetermined criteria. One of the window strobes is used to test one of the signals, and the other window strobe is generated relative to the first window strobe. The second window strobe tests the other signal (or signals, if they are data signals). From the tests of the two window strobes, it can be determined if the skew between the first and second signals meets predetermined criteria. In particular, the two window strobes are placed relative to each other and to the signals being tested in such a way that when both window strobes indicate passing conditions, skew between the two signals is guaranteed.

26 Claims, 8 Drawing Sheets

METHOD FOR TESTING AND GUARANTEEING THAT SKEW BETWEEN TWO SIGNALS MEETS PREDETERMINED CRITERIA

BACKGROUND OF THE INVENTION

1. Technical Field

This invention relates to the field of testing semiconductor devices. More specifically, the invention relates to a method for testing and guaranteeing that skew between two signals meets predetermined criteria.

2. Background Art

Computer chips have become extremely complex: Millions of logic devices can be made to fit on one chip. Because of this complexity, it is essential that these chips be tested. Prior to use, the computer chip is placed into a tester to ensure that signals meet timing requirements. One important criterion for testing signals is skew. Skew is the difference in arrival time, at a particular location, between two signals. For some signals, it is desired that there be very little skew. Generally, limits are placed on the skew between two or more signals so that the signals arrive at a specific location at about the same time. If the signals do not meet skew requirements, it is possible for incorrect data to be read or written.

Skew is particularly important for memory devices. For memory, the data must be valid for a particular time period before the memory controller or other device reads the data. If this is not the case, incorrect data may be read.

With Synchronous Dynamic Random Access Memories (SDRAMs), data output supplied by the DRAM during read cycles is available on the data pins a certain time after a rising clock edge provided to the SDRAM. This time period is known as tAC, or access time from CLK, and is typically in the 5–6 nanosecond (ns) range. Such a period is shown in FIG. 7, which shows a typical SDRAM cycle. In this cycle, the data (which are labeled DQ) must be available on the data pins a certain time after the rising clock edge shown in the figure. The clock has a 10 ns period, beginning at 25 ns, and a rising clock edge at 25 ns. Individual data signals from the data are transitioning in the hashed region. Ideally, each data signal would transition at the same time, but inaccuracies cause some of the data signals to transition at different times. Each data signal must complete its transition before the memory controller or other device reads the data.

The tAC timing parameter is a maximum specification (illustrated as tAC(max) in FIG. 7) and must be guaranteed by testing each device. This is accomplished on standard memory testers by "strobing" the DQ outputs with a tester "edge strobe". The edge strobe is strobed 5–6 ns after a certain rising clock edge. The edge strobe is also shown in FIG. 7. If the data captured by the edge strobe is valid (and this is repeated for all column address locations), then the device is verified to pass the tAC(max) specification. Due to tester inaccuracies of strobing the data exactly (for instance) 5 ns after the rising clock edge, a tester "guardband" must be accounted for when taking the tAC(max) measurement. This guardband is specified by the tester vendor and is typically in the 200–350 picosecond (ps) range. Because of the edge strobe placement inaccuracy, the edge strobe may be generated anywhere in the range of 4.7 to 5.3 ns. Therefore, in order to guarantee that a device under test meets the tAC(max) specification, the tester "edge strobe" is set at 4.7–4.8 ns to guarantee a 5 ns tAC(max). This "guardbanding" requirement often results in over testing the device and results in unnecessary yield loss.

Currently, Double Data Rate (DDR) DRAMs have been introduced. With the introduction of DDR SDRAMs, the DRAM read cycles have been enhanced to include the addition of a data strobe. The purpose of the data strobe is to coincidently drive a source synchronous signal from the DRAM with the valid read data. The data strobe essentially informs the reading devices as to when the data is valid. The data strobe and the data are sourced from the same chip and the DQS and data signals travel together on a set of parallel wires that should be laid out identically. This minimizes the skew that would otherwise occur between the system clock and the data driven from the DRAM. When the data strobe arrives at the memory controller, it is delayed by some amount and then used to latch the data into the memory controller.

The data strobe (DQS) is an edge driven strobe that transitions from low to high coincident with the first data driven out of the RAM on the read cycle; it then transitions from high to low with the second data delivered from the RAM. The data strobe continues to transition low to high and high to low with all valid data driven consecutively from the RAM.

The purpose of the data strobe is to provide a latching signal from the RAM to the memory controller to indicate that valid data is on the data bus for the memory controller to capture or latch. A typical DDR DRAM cycle is shown in FIG. 8. The data strobe (DQS) is nominally aligned with the clock (CLK). The data strobe (DQS) is also nominally aligned to be valid at the same instant that data (DQ) is valid on the bus. However, due to p- and n-channel processing skews, data pattern dependent noise, and physical layout mismatches of the chip, there can exist a skew between valid data strobe and valid data. This skew may be positive. In this case, the data strobe arrives before the data. The maximum tolerable skew in this instance is referred to as tDQSQ(max). This skew may also be negative. In this case, the data strobe arrives after the data. The maximum tolerable skew in the negative skew case is referred to as tDQSQ(min). In both cases, the receiving device must know how large this skew is so that it can properly delay the data strobe an appropriate amount to position it in the middle of the valid data window to properly latch the data. This is shown in FIG. 8. Also shown in FIG. 8 is the nominal tDQSQ, which is indicated as tDQSQ(nom) and which means that the data strobe arrives exactly at the same time that the data becomes valid.

With the current installed base of manufacturing testers, it becomes hard to measure the data strobe-to-data skew. The data strobe-to-data skew is typically in the range of 500 to 600 ps and is very difficult if not impossible to measure directly on a tester using a single "edge strobe" in a similar manner to the method used to measure tAC(max). Because the data strobe generated by the RAM is not fixed with respect to the input clock, and because the data is not fixed with respect to the clock or the data strobe, an "edge strobe" measurement is ineffective in measuring the skew between data strobe and the data signals.

There are two reasons for this. First, the edge strobes are generally referenced from the clock. For instance, in FIG. 8, edges 1 and 2 are referenced from the falling edge of the clock that occurs at 22.5 ns. The first edge strobe (edge strobe 1) is made to "exactly" strobe on the clock's falling edge, while the second edge strobe should strobe at the tDQSQ(min) time. However, although the data strobe is shown synchronized to the clock, the data strobe generally lags the system input clock. DDR DRAMS contain a digital locked loop (DLL) on the chip that aligns both the data strobe and data to the system clock during read cycles;

however, the DLL is not perfectly accurate. It has resolution errors, and will be off by some number of picoseconds. This means that the edge strobes, which are referenced to the clock, are trying to track the data strobe and data signals, which are only marginally referenced to the clock.

Secondly, the important signals being measured are the data skew. This skew ranges from about 500 to 600 ps. Ideally, one edge strobe on the tester would be exactly aligned with the rising or falling edge of the data strobe, and another edge strobe would be exactly aligned with a location or time at which the data becomes valid. This is shown in FIG. 8, where at time 1 the first edge strobe aligns with the falling edge of the data strobe and at time 2 the second data strobe aligns with the point at which the data becomes valid. If the absolute time difference between the two edge strobes is less than tDQSQ(min), then the memory device meets the criteria for skew. If the time difference is greater than tDQSQ(max), then the memory device does not meet the criteria for skew. Because there are errors in the placement of the edge strobes, it is very hard to measure 500–600 ps without over- or under-testing the actual skew. For example, in FIG. 8, the second edge strobe might (due to placement error) actually rise at time 3 instead of time 2. This would cause edge strobe 2 to strobe invalid data, which would indicate an error for a cycle that is within specifications. Commonly, edge strobes can have errors in edge strobe placement of 300 or more picoseconds. Thus, it is impractical to try to measure a data strobe-to-data skew of 500 ps with two edge strobes fixed relative to the system input clock, with each strobe having placement accuracy error up to 300 ps, and where the skew has cycle-to-cycle variability.

It is possible for the testers to be improved upon to reduce the edge strobe error. However, this results in significant cost and renders current tester useless. Other ways of ensuring skew is by guaranteeing by design or by characterization or by using a "sample and average" technique. However, these are only estimates or theoretical assumptions and actual devices may fail outside the statistical limits.

For these reasons, what is needed a method to determine if skew between signals is within specifications, without creating new testing devices or creating potentially invalid assumptions.

DISCLOSURE OF INVENTION

To overcome these problems, the present invention generates two window strobes and uses the two window strobes to determine if skew between two signals meets predetermined criteria. One of the window strobes is used to test one of the signals, and the other window strobe is generated relative to the first window strobe. The second window strobe tests the other signal (or signals, if they are data signals). From the tests of the two window strobes, it can be determined if the skew between the first and second signals meets predetermined criteria. In particular, the two window strobes are placed relative to each other and to the signals being tested in such a way that when both window strobes indicate passing conditions, skew between the two signals is guaranteed.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE(S) FOR CARRYING OUT THE INVENTION

Figure 1:
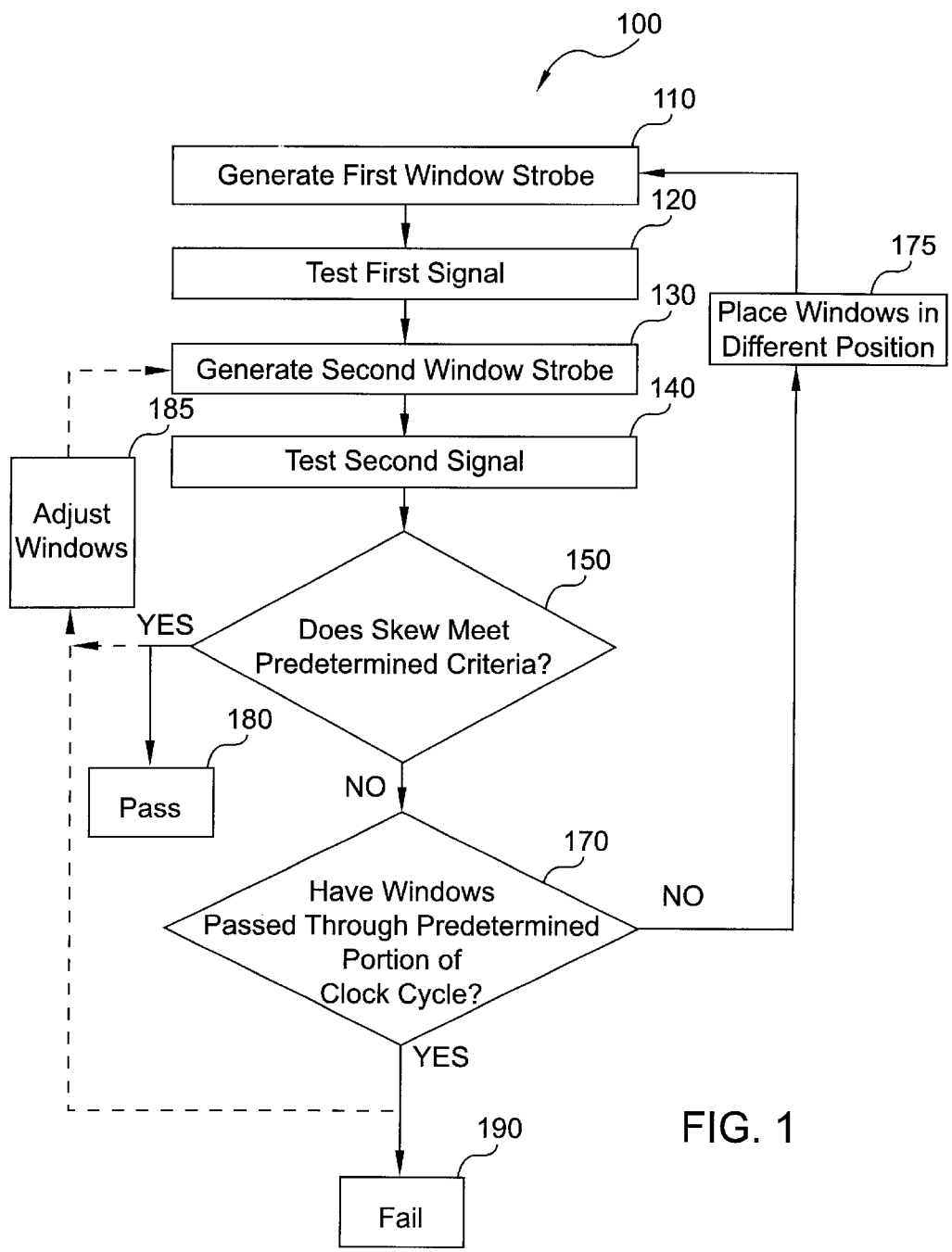
FIG. 1 is a method for testing and guaranteeing that skew between two signals meets predetermined criteria in accordance with a preferred embodiment of the present invention.

To overcome the problems of the prior art, the present invention generates two window strobes and uses the two window strobes to determine if skew between two signals meets predetermined criteria. One of the window strobes is used to test one of the signals, and the other window strobe is generated relative to the first window strobe. The second window strobe tests the other signal (or signals, if they are data signals). From the tests of the two window strobes, it can be determined if the skew between the first and second signals meets predetermined criteria. In particular, the two window strobes are placed relative to each other and to the signals being tested in such a way that when both window strobes indicate passing conditions, skew between the two signals is guaranteed.

The present method is applicable to any two signals where the first signal is longer in time than the second signal and where there is some minimum or maximum relative skew between the two signals. In the most preferred embodiment of the present invention, the tested and guaranteed skew will be between the data strobe of a Double Data Rate (DDR) Synchronous Dynamic Random Access Memory (SDRAM) and the data output signals of the same.

Most preferably, the first window strobe is generated so that it is active at least as long as the first signal is in a particular state. Window strobes test signals by determining if the signal under test is the same state for the entire time that the window strobe is active. The first window strobe tests the first signal to determine if the first signal is a particular state for the entire time that the first window strobe is active. If the first signal changes states while the first window strobe is active, then the first window strobe indicates a failure; if the first signal remains the same state for the entire time that the first window strobe is active, then the first window strobe indicates a pass.

The second window strobe is generated so that it is active at least as long as the second signal is a particular state. The second window strobe is generated relative to the first window strobe, and is placed "within" the first window strobe. The time difference between when the first window strobe becomes active and when the second window strobe becomes active should be at least as long as one of the skews between the first and second signals. The time difference between when the second window strobe becomes inactive and when the first window strobe becomes inactive should be at least as long as another of the skews between the first and second signals.

If the first and second window strobes are aligned correctly, each skew will be guaranteed because the two windows are designed and placed such that the skews between the signals are tested merely by determining if the signals are the correct values while the window strobes are active. Moreover, the second window strobe may be moved relative to the first window strobe and may have its width lengthened in order to more adequately test the skew between signals. These concepts are more easily explained with reference to the following figures.

Figure 2:
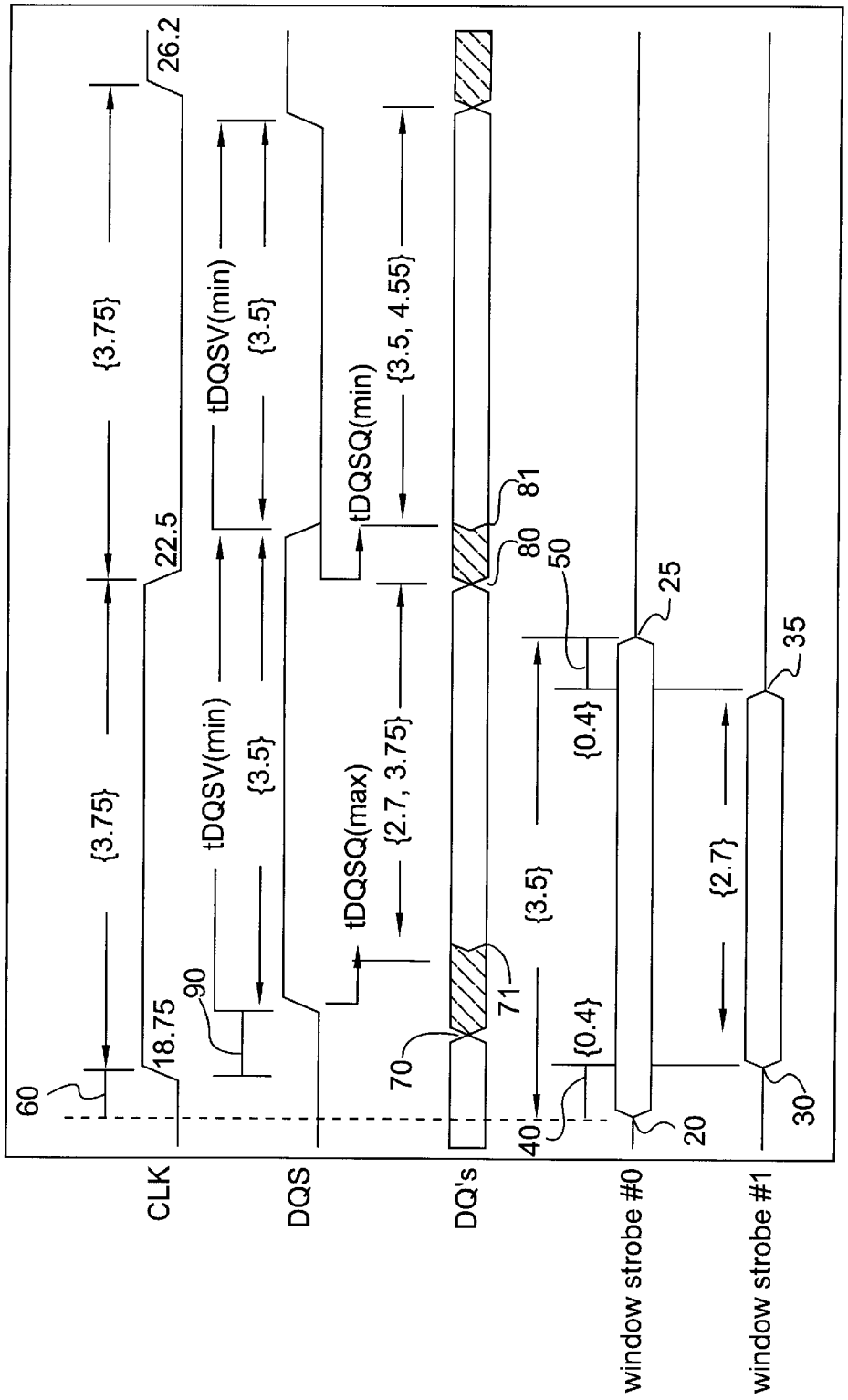
FIGS. 2 through 6 illustrate various steps of the method of FIG. 1 as the method is used to test a memory device in accordance with preferred embodiments of the present invention.

Turning now to FIG. 1, a method is shown that tests and guarantees that skew between two signals meets predetermined criteria. Method 100 of FIG. 1 is used to test a computer chip. The computer chip is placed in a tester and a tester is programmed to perform the steps of method 100. Method 100 is most easily explained with reference to timing diagrams. Referring now to FIG. 2 in addition to FIG. 1, FIG. 2 shows a timing diagram for a DDR SDRAM under test, as the DDR SDRAM would be tested by method 100. In FIG. 2, the system clock has about a 7.5 nanosecond (ns) cycle. The data strobe (DQS) is slightly skewed from the clock. The amount of skew is indicated by time 90. Thus, although to a first order the data strobe is aligned with the clock, in real devices there is some skew between the two. There is also skew between the data strobe and the data (DQ's). This can be seen in FIG. 2 because time 70 does not line up with the rising edge of the clock.

In FIG. 2, the shaded regions indicate areas where the data bits are changing. For DDR SDRAMs, the output is either 4 or 8 bits per data strobe. This means that multiple data bits must be valid prior to the data being read. The data strobe, because it indicates when the data is valid, must meet certain skew requirements. The skew requirements are determined from the last data bit to change state during a read. For instance, the first data bit changes state at times 70, 80 and the last data bit changes state at times 71, 81. The skew requirements would be determined from the rising or falling edge of the data strobe to time 71 or time 80, respectively.

Prior to testing a device with method 100, a designer will know what the specifications for data strobe-to-data skew are. The maximum data strobe-to-data skew is shown in FIG. 2 as tDQSQ(max). This is a positive skew because the data transitions after the data strobe transitions. The minimum data skew is shown in FIG. 2 as tDQSQ(min). This is a negative skew because the first data bit transitions before the data strobe transitions. The maximum data strobe, minimum data strobe and clock cycle time should be known. From this information, the other information, such as approximate data strobe cycle time, data strobe active and inactive time periods, and data active and switching time periods, may be derived.

Method 100 may be thought of as having two stages, although the stages can be combined. Initially, the method determines skew values that should meet the predetermined criteria for skew. This allows the window strobe sizes and their relative locations to be determined, at least initially. The method can then be used to "fine tune" the skew to guarantee the skew between the data strobe and the data. This results in a more complete analysis of the part being tested.

In FIGS. 2 through 6, it is assumed that a DDR SDRAM is being tested that has a data strobe valid minimum time [tDQSV(min)] of 3.5 ns, a tDQSQ(max) of 400 ps, and a tDQSQ(min) of 400 ps. The time ranges, such as {2.7, 3.75}, indicated the valid time and the switching range. For instance, a set of signals might have a composite valid time of 2.7 ns but individual signals may have longer valid time periods (3.7ns) where individual signals are slightly offset or skewed from each other. This is particularly true for data, as each data bit might switch states at a slightly different time. It should be noted that the particular scenarios shown may not be the scenarios that occur to an actual product under test. For instance, in FIG. 2 the maximum data strobe-to-data skew occurs immediately before the minimum data strobe-to-data skew. This would likely not occur in practice, since the particular data pattern used to generate the worst case data strobe-to-data skew (tDQSQmax) at the beginning of the cycle will not cause the worst case data strobe-to-data skew (tDQSQmin) to occur at the end of the same cycle. However, the figures do serve to illustrate the methods of the present invention.

In step 110 of method 100, the first window strobe is generated. The width of one of the window strobes (shown in FIG. 2 as "window strobe 0" and beginning at time 20 and ending at time 25) is chosen to be about as large as the minimum expected data strobe half-cycle, shown as tDQSV (min) in FIG. 2. This window strobe is used to determine when the data strobe (DQS) is a particular state for a particular length of time. In the case of FIG. 2, the window strobe zero is set to 3.5 ns, which is the expected tDQSV (min) of the data strobe. The window may be set to determine that the data strobe is a high value and for a predetermined period of time or could be set to determine that the data strobe is a low value and for a predetermined period of time. In the example that will be discussed herein, window strobe zero is testing the data strobe for a high value for the time that the window strobe is enabled. If the data strobe is not a high value for the entire time that the window strobe is enabled, the tester will indicate a failure. This could occur, for instance, if the data strobe starts as a high value but transitions to a low value or starts as a low value and transitions to a high value. In step 120, the first signal, in this case the data strobe, is tested to determine if the signal satisfies a first condition for the time period that the window strobe zero is active. In the example of FIG. 2, window strobe 0 is looking for a high value on the data strobe.

It should be noted that steps 110–140 of FIG. 1 should be performed concurrently to capture the data strobe-to-data skew for that particular cycle. For instance, the first and second window strobes can be generated at the same time and tested at the same time.

Steps 110 and 120 are attempting to find a time when the window strobe indicates a valid condition for the data strobe. The window strobe is placed relative to the clock. For instance, the initial placement of window strobe zero occurs at time differential 60, which is a time relative to the rising edge of the clock. As method 100 is iterated, the window strobe zero will be moved or "shmooed" through the clock cycle until the window strobe encounters a passing condition, which will occur when the data strobe is a high value (in this example) for the entire time that the window strobe is valid. If the window strobe is moved through half the clock cycle, and there is no passing condition, then the data strobe was less than the minimum width of the window strobe. Steps 110 and 120 can be repeated, choosing different locations for window strobe zero and different widths for the window strobe until a passing condition occurs. It is also possible for steps 110 and 120 to be performed in parallel with generation and placement of the second window strobe, which is what method 100 assumes. However, steps 110 and 120 could be repeated prior to performing step 130, if desired.

The reason for repeating these steps and moving the first window strobe through the clock cycle is that the data strobe is not necessarily aligned with the clock cycle. Ideally, the data strobe and the clock would transition at exactly the same time. However, because of inaccuracies in generating each signal, time delays in reaching a particular location, Digital Locked Loop (DLL) inaccuracies in phase-aligning the internal clock to the external system clock, and different rise and fall rates for different output stages, the signals may not be aligned. For instance, in the example of FIG. 2, the rising edge of the data strobe is a length 90 away from the rising edge of the clock. This clock-to-data strobe skew makes it relatively hard to test the skew associated with the data strobe, as edge strobes and window strobes are referenced to the rising CLK edge. Moreover, the data can also have a skew from the clock, so they are also hard to test using normal clock-based testing methods.

In step 130, the second window strobe is generated relative to the first window strobe. In FIG. 2, the second window strobe (marked as "window strobe 1" and beginning at time 30 and ending at time 35). The window strobe one is referenced to the clock signal (in this case, the rising edge of the clock signal), but is placed within window strobe zero and placed relative to the two ends 20, 25 of window strobe zero. Preferably, window strobe one initially has a width of about the minimum width of the data strobe minus the minimum and maximum data strobe-to-data skews. In terms of FIG. 2, this would be tDQSV(min)−tDQSQ(min)−tDQSQ(max), which is 3.5 ns minus 0.4 ns minus 0.4 ns, or 2.7 ns.

The second window strobe is being generated to test the data valid time. The data is switching during the region between times 70 and 71 and between times 80 and 81. The second window strobe is generated initially to not only test the data valid time but to also test the data strobe-to-data skews. The second window strobe has a width that should be about as long as the data is expected to be valid. Additionally, the second window strobe is placed relative to the first window strobe such that there is about the space of the maximum data strobe-to-data skew at time difference 40 between the start 20 of the first window strobe and the start 30 of the second window strobe. In step 140, the data signals are tested by the second window strobe to determine if the signals are the correct values for the entire time that the second window strobe is valid. As is known in the art, there will be certain combinations of data that will cause longer data strobe-to-data skew. Such combinations are called worst case data patterns, and can vary depending on the memory design. For instance, having seven data bits transition high while one data bit is transitioning low is a worst case data pattern for some memories. The simultaneous switching events cause the maximum data skew. When the data signals are tested for a condition, each data signal must be a particular value for the entire time that the second window strobe is valid. For example, one of the data bits might have to be a low value (or a "zero") for the entire valid time to meet this condition, while another of the data bits might have to be a high value (or a "one") for the entire valid time to meet this condition.

By placing the window strobes in the manner discussed previously, when both window strobes indicate valid conditions for their respective signals, the minimum and maximum date strobe-to data skews are guaranteed. This will be discussed in more detail below.

In FIG. 2, both the window strobes will indicate a failure (steps 120 and 140), as the data strobe and data are not stable during the entire time their respective window strobes are valid. Thus, in step 150, it is determined that the skew does not meet the predetermined criteria (step 150=NO). In step 170, the window strobes have not passed through a predetermined portion of the clock cycle (step 170=NO), so the windows are repositioned (step 175). Preferably, steps 110 through 170 are iterated, adjusting the location (and perhaps width or offset) of the two window strobes until both window strobes indicate passing conditions. In FIG. 2, window strobe zero is placed a length 60 from the clock. Window strobe one is placed a length 40 from the beginning 20 of window strobe zero and a length 50 from window strobe zero. Generally, the tester that generates window strobe one is given a time from the clock to make the window strobe become active and a length of time for the window strobe to remain active. The relative time from the clock, at which window strobe one will be active, is chosen to meet the length 40 requirement. The length of time that the window strobe remains valid is chosen to meet the length 50 requirements and to adequately test the valid data time.

Figure 3:
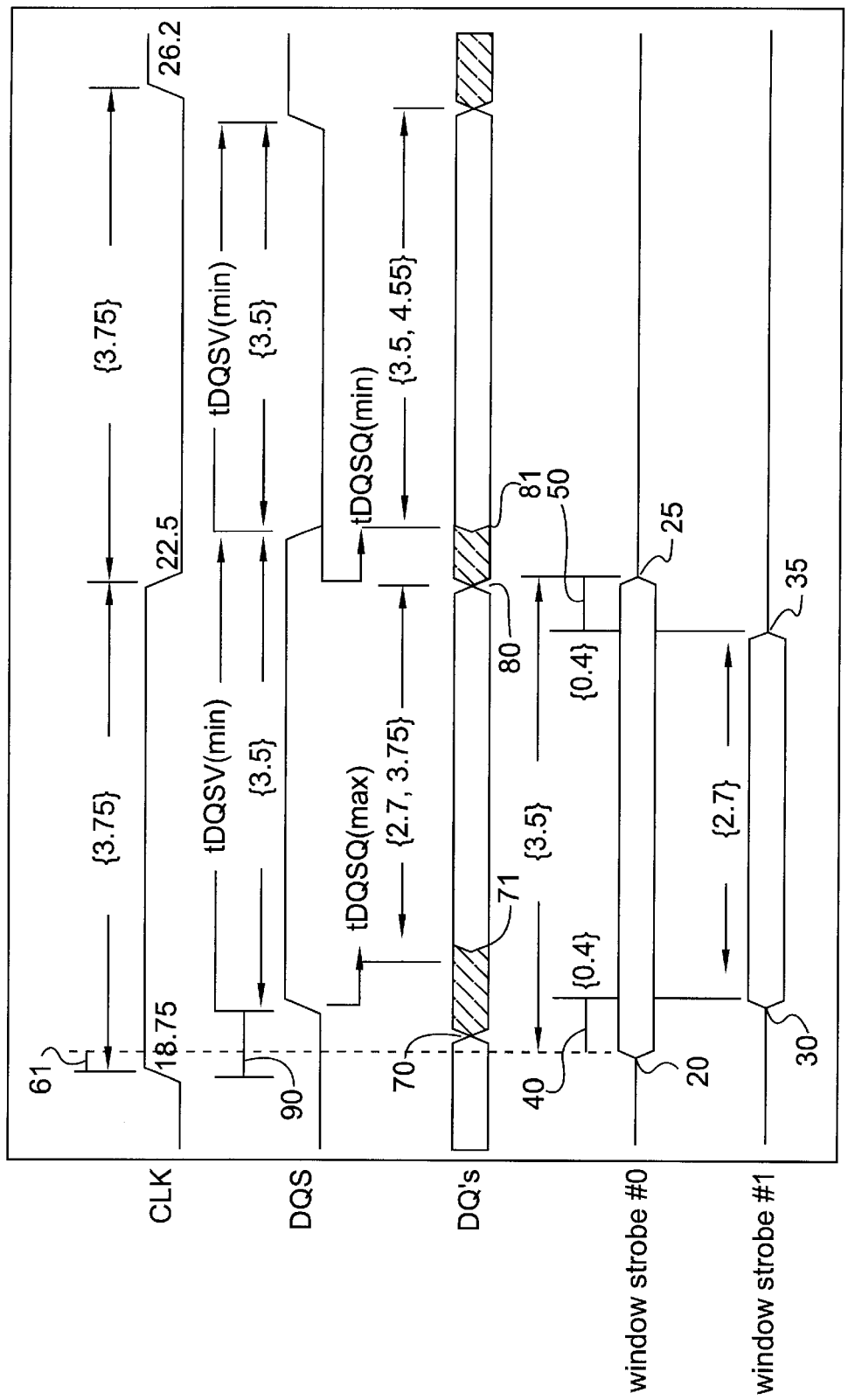

In step 175, the windows are placed in different positions. In FIG. 3, it can be seen that window strobe zero is now a length 61 from the rising edge of the clock. Moreover, the window strobe starts after the rising edge of the clock, unlike in FIG. 2 where the window strobe started before the rising edge of the clock. It is up to the designer as to how much time (relative to the clock) the first window strobe should be moved with each iteration. If the window strobe is moved too much, the first window strobe may not ever align with the data strobe; on the other hand, moving the first window strobe too little will increase testing time.

In step 130, the second window strobe (window strobe one) is placed relative to the clock such that lengths 40, and 50 are maintained. In step 140, it is determined that both window strobes indicate failing conditions. For window strobe zero, the data strobe is not stable for the entire length of the window strobe; for window strobe one, the data are not stable for the entire length of this window strobe. Thus, in step 175, the two window strobes are repositioned.

Figure 4:
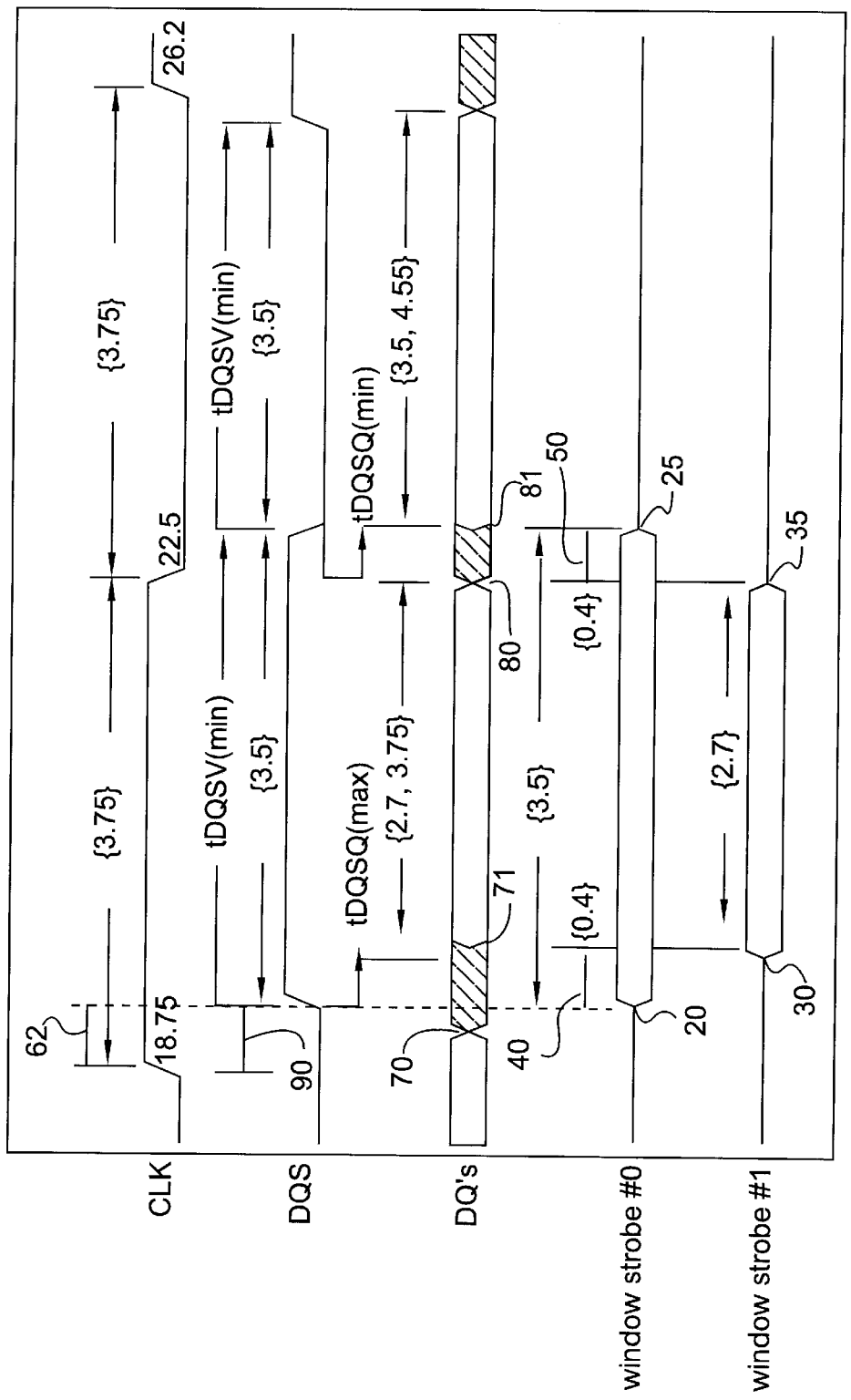

In FIG. 4, the result of steps 175, 110, and 130 is shown. Window strobe zero now is distance 62 from a rising edge of the clock. As a result of sliding or "shmooing" the window strobes relative to the clock, window strobe zero now aligns with a valid region of the data strobe and window strobe one now aligns with a valid region of the data. During these valid regions, the signal is a particular value for the time that the window strobe exists. Therefore, the test of the first window strobe (step 120) and the test of the second window strobe (step 140) will both indicate passing conditions. For these passing conditions to occur, there are some data transitions in areas 40, 50 but no data changes state during window strobe one and the data strobe does not change state during window strobe zero.

If length 40 is equal to the maximum data strobe-to-data skew, then the actual tested data strobe-to-data skew is guaranteed to be less than or equal to the maximum skew. If the actual tested data strobe-to-data skew were greater than the maximum skew, the window strobe one would indicate a failing condition (if the data changes too late) or the window strobe zero would indicate a failing condition (if the data strobe changes too early).

If length 50 is equal to the minimum data strobe-to-data skew, then the actual tested data strobe-to-data skew is guaranteed to be less than or equal to the minimum skew. If the actual tested data strobe-to-data skew were greater than the minimum skew, the window strobe one would indicate a failing condition (if the data strobe changes too late) or the window strobe zero would indicate a failing condition (if the data changes too early).

For FIG. 4 and step 150 of method 100, the skew meets the predetermined criteria because both the first window strobe (window strobe zero in FIG. 4) and the second window strobe (window strobe one in FIG. 4) report that the signals tested by the window strobes are valid for the entire time that the window strobes are enabled. Therefore, the skew has been guaranteed and the method can end in step 180.

Figure 5:
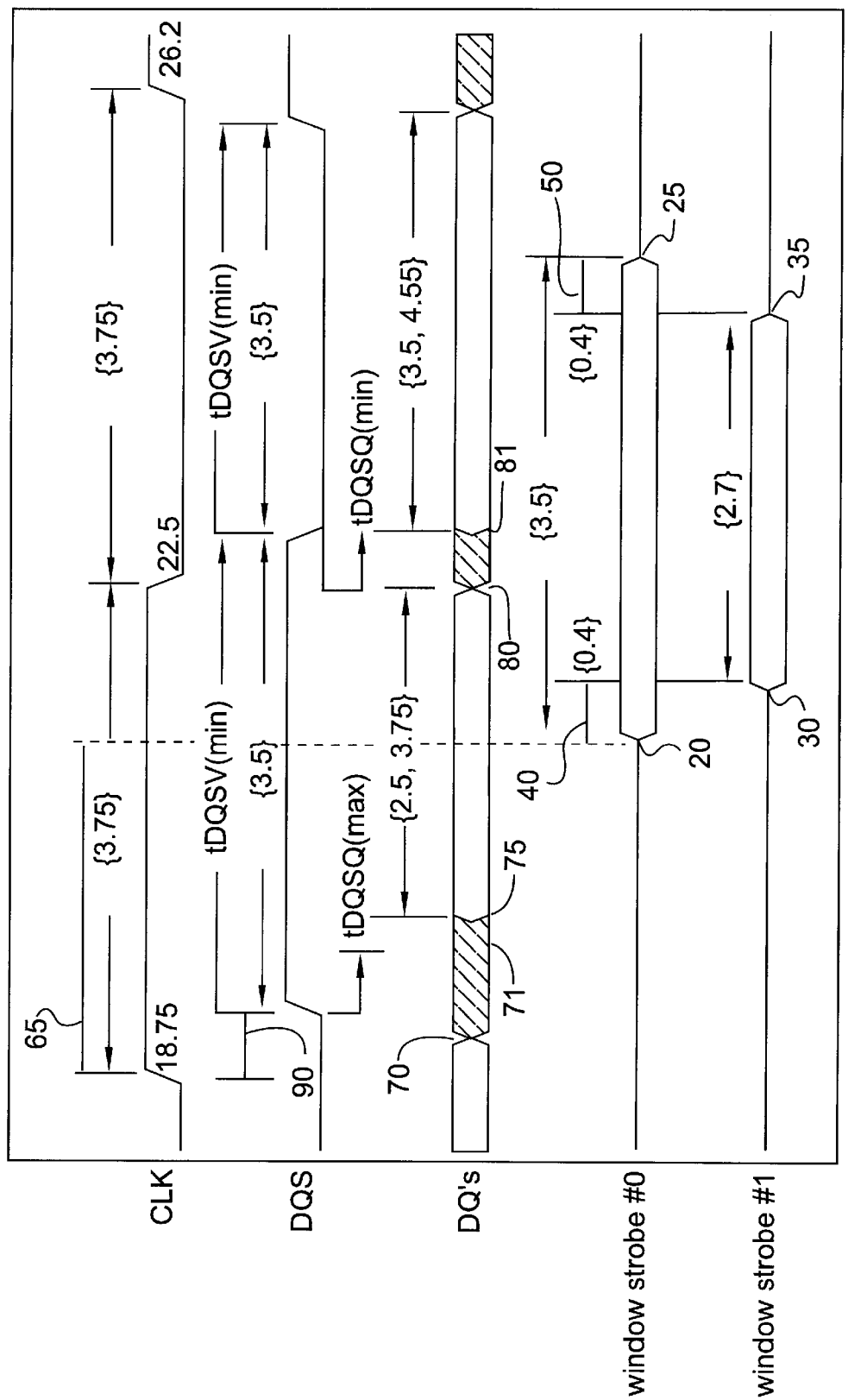
Figure 6:
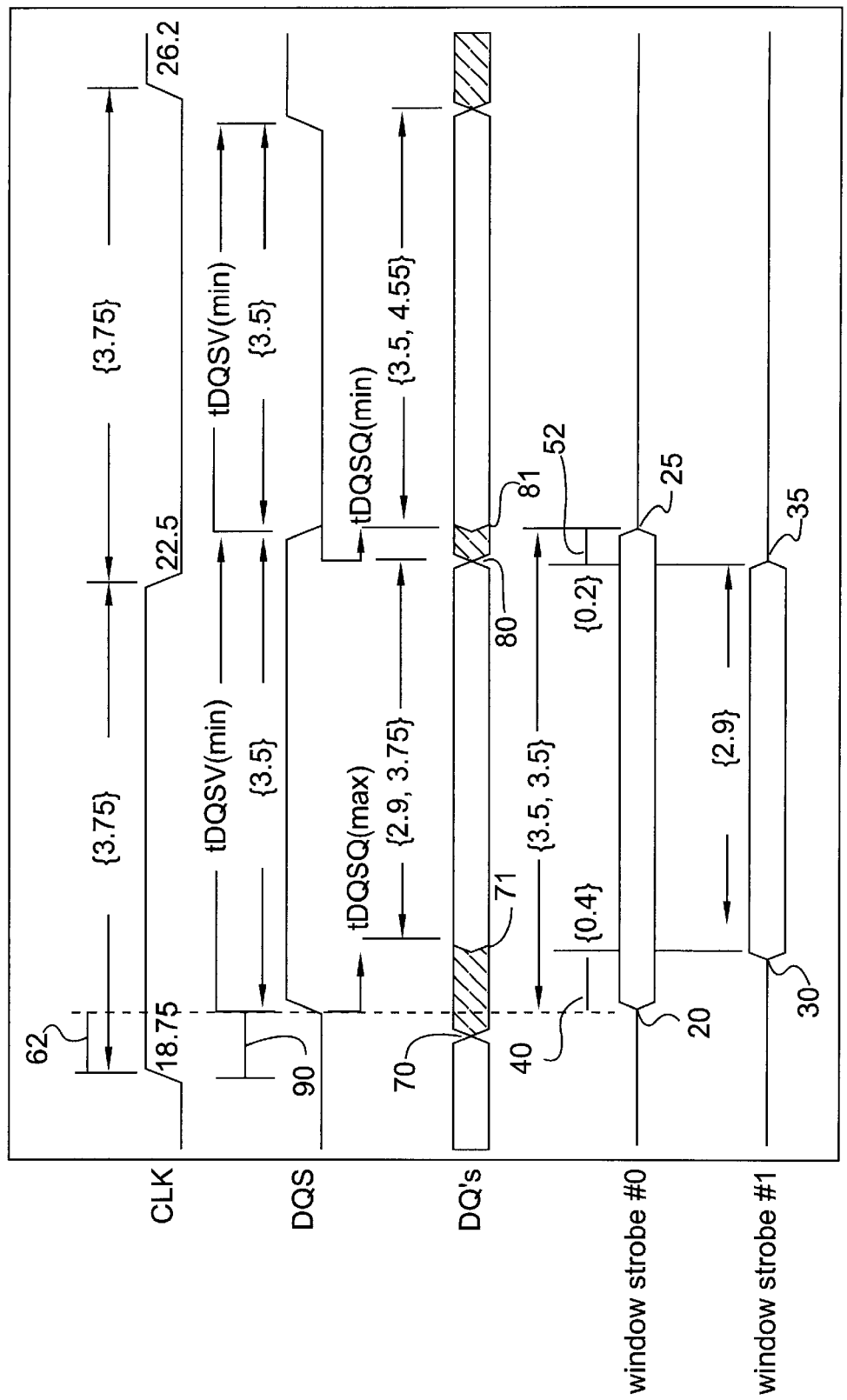
Figure 7:
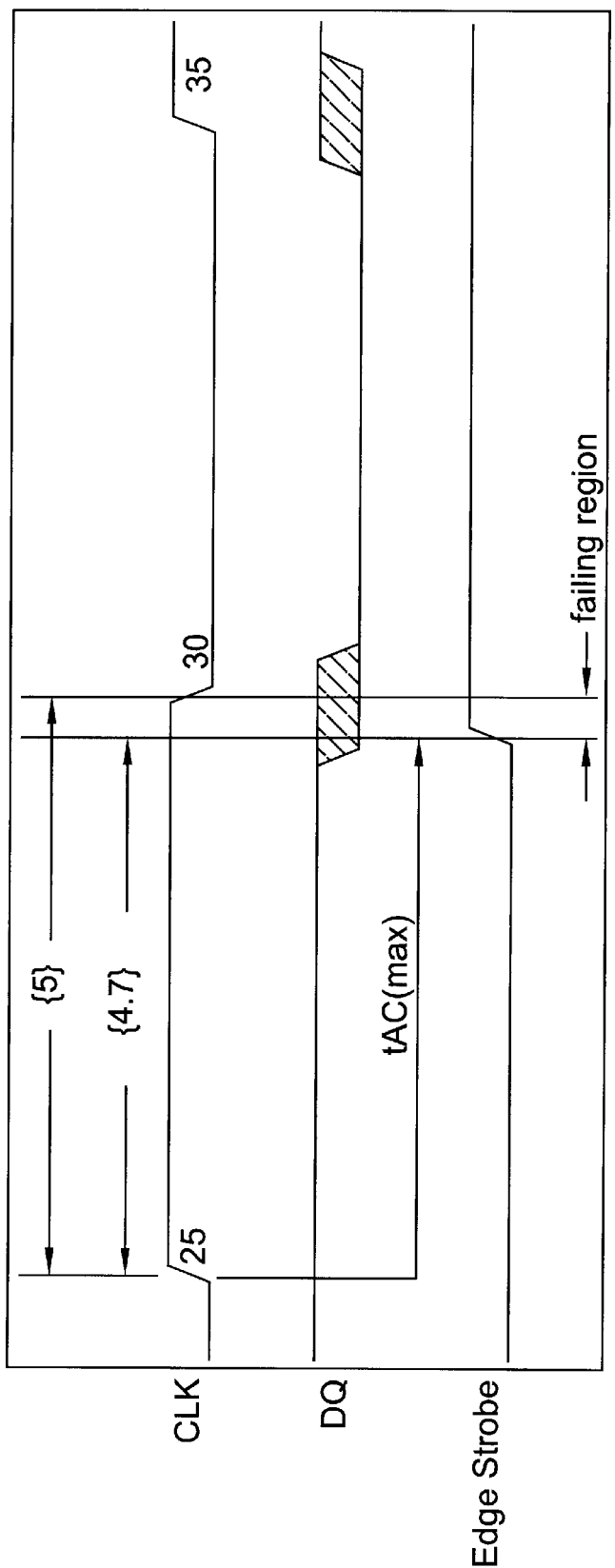
FIG. 7 is a prior art timing diagram for a Synchronous Dynamic Random Access Memory (SDRAM) that is being tested.
Figure 8:
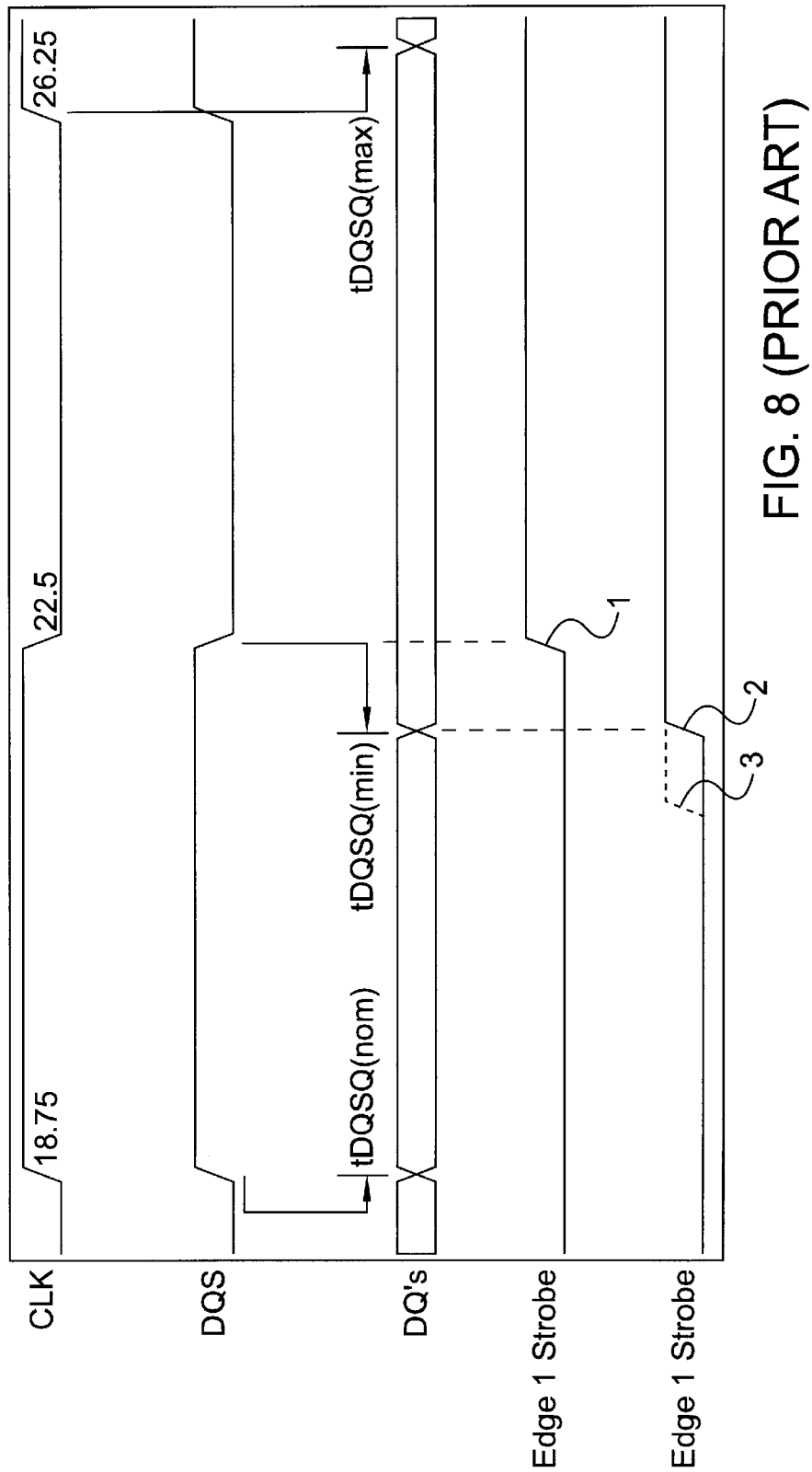
FIG. 8 is a prior art timing diagram for a double data rate SDRAM that is being tested.

In FIG. 5, however, a non-passing output of a memory is shown. In this version, the length from time 80 to time 81 remains the same. However, the data changes late during the initial part of the cycle. Instead of settling by time 71, the data switches until time 75. This is too long of a time period, relative to the data strobe, and in step 150 there will be a failure (step 150=NO). In fact, there will be no location to which the window strobes may be placed in order for the window strobes to both indicate passing conditions since the data valid time defined by the delta between 75–80 is always less than the width of window strobe 1 defined by 30–35. The first window strobe (window strobe zero) will be able to be properly positioned such that it will indicate a passing condition for the data strobe. However, when the second window strobe (window strobe one) is placed relative to the first window strobe and placed such that time span 40 is equal to the maximum data strobe-to-data skew, there will be no location at which the two window strobes may be placed during which the second window strobe will indicate a passing condition for the data. The data is simply taking too long to change, and the data valid time of 2.5 ns is less than the expected time, indicated by the second window strobe, of 2.7 ns. This memory has failed the maximum data strobe-to-data skew.

Thus, in step 170, the windows will get to a certain location away from the clock where it will be known that the memory has failed (step 170=YES). In this simple example, this location is length 65 from the rising clock edge. This memory has failed the data strobe-to-data skew test (step 190).

If the memory fails the skew test, or passes the skew test, the window strobes could be adjusted relative to each other (step 185). For instance, each window strobe will have some error associated with the window strobe, such as a 350 ps error. This error should be taken into account. One way of doing this would be to move location 25 to the right by 350 ps, location 20; to the left 350 ps, location 35 to the left 350 ps, and location 30 to the right 350 ps. This would test each "corner" of the possible errors. These could be moved individually or together. Dealing with tester inaccuracies is well known in the art.

Another reason to adjust the relative positions of the window strobes is because the particular patterns used or the particular memory tested may cause one skew to be smaller than another skew. For instance, in FIG. 6, the first data strobe-to-data skew (from time 70 to time 71) is unchanged, but the second data strobe-to-data skew is small. To adequately test the second skew, relative distance 52 is made smaller (0.2 ns instead of 0.4 ns). To support this operation, the second window strobe's length is increased from 2.7 ns to 2.9 ns.

By testing skew in this manner, not only can the skew be guaranteed, but it can also be determined as to how much room for error there is in the skew.

What has been shown is a method for guaranteeing that skew between two signals meets predetermined criteria. By careful placement and monitoring of two window strobes, each strobe targeted to and testing one signal, the skew between two signals can be guaranteed to meet predetermined criteria.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A method for testing skew between first and second signals, the method comprising the steps of:
   a) generating a first window strobe that tests the first signal;
   b) testing for a first condition of the first signal;
   c) generating, relative to the first window strobe, a second window strobe that tests the second signal;
   d) testing for a second condition of the second signal; and
   e) determining, from the testing of the first and second window strobes, if skew between the first and second signals meets predetermined criteria.

2. The method of claim 1 wherein the first condition comprises having the first signal be a state that exists for a predetermined time.

3. The method of claim 1 wherein the second condition comprises having the second signal be a state that exists for a predetermined time.

4. The method of claim 1 wherein the step of determining, from the testing of the first and second window strobes, if skew between the first and second signals meets predetermined criteria comprises the step of determining if the first and second conditions are met.

5. The method of claim 1 further comprising the steps of:
   f) prior to step (a), placing the first window strobe at a predetermined time away from when the first condition of the first signal is expected to start;
   g) ending the method if the skew does meet the predetermined criteria; and
   h) if the skew does not meet the predetermined criteria:
      i) placing the first window strobe at another predetermined time away from when the first condition of the first signal is expected to start; and
      ii) performing steps (a) through (h)(i), selecting different predetermined times for each step (f) until either the method ends in step (g) or the first window strobe passes through a predetermined portion of a clock cycle.

6. The method of claim 5 wherein the step of generating, relative to the first window strobe, a second window strobe that tests the second signal comprises the step of generating the second window strobe at a predetermined offset time from the first window strobe.

7. The method of claim 6 wherein the step of generating, relative to the first window strobe, a second window strobe that tests the second signal comprises the step of generating the second window strobe for a particular valid time, and wherein the method further comprises the step of:
   f) performing the steps of (a) through (e), choosing a different particular valid time each iteration through the method, until the skew meets the predetermined criteria.

8. The method of claim 1 wherein the step of generating a first window strobe comprises the step of generating a first window strobe relative to a clock and wherein the step of generating a second window strobe relative to the first window strobe comprises the step of generating the second window strobe relative to the clock.

9. A method for testing skew between a data strobe and a plurality of data signals from a memory device, the method comprising the steps of:
   a) generating a first window strobe having a first beginning and a first end, the first window strobe testing the data strobe;
   b) testing for a first condition of the data strobe;
   c) generating, relative to the first window strobe, a second window strobe that tests the plurality of data signals, the second window strobe having a second beginning and a second end, and wherein the second window strobe is positioned such that the second beginning is after the first beginning and the second end is before the first end;
   d) testing for a second condition of the plurality of data signals; and
   e) determining, from the testing of the first and second window strobes, if skew between the data strobe and the plurality of data signals meets predetermined criteria.

10. The method of claim 9 wherein the step of generating, relative to the first window strobe, a second window strobe that tests the plurality of data signals further comprises the step of selecting the second beginning so that a time difference between the second beginning and first beginning is a predetermined time difference; and wherein the method further comprising the step of:
   f) performing steps (a) through (e), selecting smaller predetermined time differences until the skew does not meet the predetermined criteria.

11. The method of claim 9 wherein the step of generating, relative to the first window strobe, a second window strobe that tests the plurality of data signals further comprises the step of selecting the second end so that a time difference between the second end and first end is a predetermined time difference; and wherein the method further comprising the step of:
   f) performing steps (a) through (e), selecting smaller predetermined time differences until the skew does not meet the predetermined criteria.

12. The method of claim 9 wherein the first condition comprises having the data strobe be a state existing for a predetermined time.

13. The method of claim 9 wherein the second condition comprises having each of the plurality data signals be one of a number of states that exists for a predetermined time.

14. The method of claim 13 wherein one of the data signals is a particular state and another of the data signals is another state.

15. The method of claim 9 further comprising the steps of:
   f) prior to step (a), placing the beginning of the first window strobe at a predetermined time away from when the first condition of the data strobe is expected to start;
   g) ending the method if the skew does meet the predetermined criteria; and
   h) if the skew does not meet the predetermined criteria:
      i) placing the beginning of the first window strobe at another predetermined time away from when the first condition of the data strobe is expected to start; and
      ii) performing steps (a) through (h)(i), selecting different predetermined times for each step (f) until either the method ends in step (g) or the beginning of the first window strobe passes through a predetermined portion of a clock cycle.

16. The method of claim 15 wherein in step (f) the predetermined time is before the first condition of the data strobe is expected to start, and wherein in step (h)(i) the another predetermined time is after the predetermined time in step (f).

17. The method of claim 9 wherein the step of generating a first window strobe having a first beginning and a first end further comprises the step of generating the first window strobe such that time between the first beginning and the first end is at least as great as a time the first condition of the data strobe is expected to last, and wherein the step of generating a second window strobe further comprises the step of generating the second window strobe such that time between the second beginning and second end is at least as great as the time the first condition of the data strobe is expected to last minus total expected skew between the data strobe and the plurality of data signals.

18. The method of claim 17 wherein the total expected skew between the data strobe and the plurality of data signals comprises a maximum data skew and a minimum data skew and wherein the step of generating a second window strobe further comprises the steps of selecting the second beginning so that time between the first beginning and the second beginning is at least the maximum data skew and selecting the second end such that time between the second end and the first end is at least the minimum data skew.

19. The method of claim 17 wherein the total expected skew between the data strobe and the plurality of data signals comprises a maximum data skew and a minimum data skew and wherein the step of generating a second window strobe further comprises the steps of selecting the second beginning so that time between the first beginning and the second beginning is at least the minimum data skew and selecting the second end such that time between the second end and the first end is at least the maximum data skew.

20. A method for testing skew between a data strobe and a plurality of data signals from a double data rate memory device, the method comprising the steps of:
   a) determining a minimum data strobe valid time for the data strobe;
   b) determining a maximum data skew;
   c) determining a minimum data skew;
   d) generating a first window strobe having a first beginning and a first end and existing for a time as long or longer than the minimum data strobe valid time, the first window strobe testing the data strobe, wherein the first beginning and first end are generated relative to an edge of a clock;
   e) testing the data strobe to determine if the data strobe is a particular state existing for the minimum data strobe valid time;
   f) generating a second window strobe that tests the plurality of data signals, the second window strobe having a second beginning and a second end and existing for a time as small or smaller than the minimum data strobe valid time minus the maximum and minimum data skews, wherein the second beginning and second end are generated relative to the clock such that the second beginning is after the first beginning and the second end is before the first end;
   g) testing the plurality of data signals to determine if each of the plurality data signals is one of two states existing for a time period from the second beginning to the second end; and h) determining, from the testing of the first and second window strobes, if skew between the data strobe and the plurality of data signals meets predetermined criteria.

21. The method of claim 20 wherein the particular state for the data strobe is a high logic value and where the step of generating a second window strobe that tests the plurality of data signals further comprises the steps of selecting the second beginning so that time between the first beginning and the second beginning is at least the maximum data skew and selecting the second end such that time between the second end and the first end is at least the minimum data skew.

22. The method of claim 20 wherein the particular state for the data strobe is a low logic value and where the step of generating a second window strobe that tests the plurality of data signals further comprises the steps of selecting the second beginning so that time between the first beginning and the second beginning is at least the minimum data skew and selecting the second end such that time between the second end and the first end is at least the maximum data skew.

23. The method of claim 20 wherein the minimum and maximum data skew are different.

24. The method of claim 20 wherein the step of generating a second window strobe that tests the plurality of data signals further comprises the step of selecting the second end so that a time difference between the second end and first end is a predetermined time difference; and wherein the method further comprising the steps of:

i) performing steps (a) through (h), selecting smaller predetermined time differences until the skew does not meet the predetermined criteria.

25. The method of claim 20 wherein the step of generating a second window strobe that tests the plurality of data signals further comprises the step of selecting the second end so that a time difference between the second end and first end is a predetermined time difference; and wherein the method further comprising the step of:

i) performing steps (a) through (h), selecting smaller predetermined time differences until the skew does not meet the predetermined criteria.

26. The method of claim 20 wherein the step of generating a second window strobe that tests the plurality of data signals further comprises the step of selecting the second beginning so that a time difference between the second beginning and first beginning is a predetermined time difference; and wherein the method further comprising the step of:

i) performing steps (a) through (h), selecting smaller predetermined time differences until the skew does not meet the predetermined criteria.

* * * * *